(12) United States Patent
Tasic

(10) Patent No.: US 11,048,833 B2
(45) Date of Patent: Jun. 29, 2021

(54) METHOD OF CALIBRATING THE STIFFNESS OF SUPPORT STRUCTURES OF A MODEL COMPRISING A MAIN STRUCTURE AND AT LEAST ONE SUPPORT STRUCTURE, THROUGH MEASUREMENT

(71) Applicant: Airbus Operations (S.A.S.), Toulouse (FR)

(72) Inventor: Milan Tasic, Toulouse (FR)

(73) Assignee: Airbus Operations (S.A.S.), Toulouse (FR)

( * ) Notice: Subject to any disclaimer, the term of this patent is extended or adjusted under 35 U.S.C. 154(b) by 544 days.

(21) Appl. No.: 15/964,316

(22) Filed: Apr. 27, 2018

(65) Prior Publication Data

US 2018/0314787 A1 Nov. 1, 2018

(30) Foreign Application Priority Data

Apr. 27, 2017 (FR) ...................................... 1753671

(51) Int. Cl.
*G06F 30/15* (2020.01)
*B64F 5/40* (2017.01)
(Continued)

(52) U.S. Cl.
CPC ................ *G06F 30/15* (2020.01); *B64F 5/40* (2017.01); *G01M 5/0041* (2013.01);
(Continued)

(58) Field of Classification Search
CPC .......... G06F 30/15; G06F 30/17; G06F 30/23; G06F 17/16; B64F 5/40; B64F 5/60; G01M 5/0041; G01L 5/22
See application file for complete search history.

(56) References Cited

U.S. PATENT DOCUMENTS

| 2003/0222871 | A1* | 12/2003 | Brombolich | ............ | G06F 30/23 |
| | | | | | 345/427 |
| 2014/0168219 | A1* | 6/2014 | Das | ........................ | G06F 30/15 |
| | | | | | 345/420 |
| 2016/0214740 | A1* | 7/2016 | Nakagawa | ............ | G01M 13/04 |

FOREIGN PATENT DOCUMENTS

FR 2935133 2/2010

OTHER PUBLICATIONS

Escobar et al. "Structural damage detection using the transformation matrix." Computers and Structures 83 (2005). pp. 357-368. (Year: 2005).*

(Continued)

*Primary Examiner* — Eunhee Kim
(74) *Attorney, Agent, or Firm* — Jenkins, Wilson, Taylor & Hunt, P.A.

(57) ABSTRACT

A method of calibrating stiffness of support structures of an assembly including a main structure and support structures includes modeling the assembly using finite elements, with a theoretical stiffness of the support structures, in moderate support load conditions, calculating calculated reaction forces for each support structure and measuring corresponding measured reaction forces. The stiffness of each support structure is calibrated by determining a calculated stiffness of each support structure based on comparison between the calculated reaction forces and the measured reaction forces. The modeling and simple measurements during an operational phase, in which the support loads are moderate, thus enable the calibration of the stiffness of the support structures. An associated method of modeling the assembly and a corresponding computer program are also disclosed.

12 Claims, 1 Drawing Sheet

(51) Int. Cl.
  *G01M 5/00* (2006.01)
  *G06F 17/16* (2006.01)
  *G06F 30/17* (2020.01)
  *G06F 30/23* (2020.01)
  *G01L 5/22* (2006.01)
  *B64F 5/60* (2017.01)

(52) U.S. Cl.
  CPC .............. *G06F 17/16* (2013.01); *G06F 30/17* (2020.01); *G06F 30/23* (2020.01); *B64F 5/60* (2017.01); *G01L 5/22* (2013.01)

(56) References Cited

OTHER PUBLICATIONS

Zheng. "Finite Element Analysis for Fixture Stiffness". Doctoral Dissertations, digitalcommons.wpi.edu. 160 Pages. (Year: 2005).*
Hutton. "Fundamental of Finite Element Analysis". The McGraw-Hill Companies, Inc. 505 Pages. (Year: 2004).*
French Search Report for French Application No. 1753671 dated Feb. 7, 2018.
Padmanabhan et al. "Load and Boundary Condition Calibration Using Full-field Strain Measurement", Experimental Mechanics; An International Journal, Kluwer Academic Publishers, BO, vol. 46, No. 5, pp. 569-578, Jun. 26, 2006.
Horta et al. "Finite Element Model Calibration Approach for Ares I-X", Modal Analysis Topics, vol. 3, pp. 1-18, Feb. 3, 2010.
Felippa."Chapter 2: The Direct Stiffness Method I", Lecture Notes on Finite Elementh Methods, pp. 2-1 to 2-17, Feb. 15, 2017. https://web.archive.org/web/20170215030047if_/http://www.colorado.edu:80/engineering/cas/courses.d/IFEM.d/IFEM.Ch02.d/IFEM.ch02.pdf.
Felippa. "Chapter 9: Multifreedom Constraints II", Lecutre Notes on Finite Element Methods, pp. 9-3 to 9-7, Feb. 15, 2017. https://web.archive.org/web/20170215030052if_/http://www.colorado.edu:80/engineering/cas/courses.d/IFEM.d/IFEM.Ch09.d/IFEM.ch09.pdf.
Felippa. "Chapter 3: The Direct Stiffness Method II", pp. 3-1 to 3-17, Mar. 29, 2017. https://web.archive.org/web/20170329060237if_/http://www.colorado.edu:80/engineering/CAS/courses.d/IFEM.d/IFEM.CH03.d/IFEM.ch03.pdf.

* cited by examiner

METHOD OF CALIBRATING THE STIFFNESS OF SUPPORT STRUCTURES OF A MODEL COMPRISING A MAIN STRUCTURE AND AT LEAST ONE SUPPORT STRUCTURE, THROUGH MEASUREMENT

CROSS-REFERENCE TO RELATED APPLICATION

This application claims priority to French Patent Application FR 1753671, filed Apr. 27, 2017, the entire disclosure of which is incorporated by reference herein.

TECHNICAL FIELD

The disclosure herein relates to the field of modeling structures, and in particular of determining the stiffness of a support structure. It applies to the calibration of the stiffness of the support structures of an assembly including a main structure and the support structures. The disclosure herein applies in particular in the context of modeling using finite elements.

BACKGROUND

Calibrating the stiffness of a support structure corresponds to determining a corrected and reliable value of the stiffness of this structure.

The disclosure herein is preferably applied in the shoring of aircraft during the manufacture thereof, the 'molding' thereof (structural conversion during manufacture) or the maintenance thereof, through which application the disclosure herein is described hereinafter.

When manufacturing or maintaining an aircraft, the latter is kept shored by an assembly of support structures. For example, the aircraft is supported by a set of props and/or cradles. Thus, each support structure may include a prop bearing a means for attachment to the structure of the aircraft at a predefined support point, or a cradle designed to receive the aircraft at a predefined support zone.

The shoring of the aircraft has to ensure that the level of stress generated at the support zones of the aircraft, on the one hand, and in the structure of the aircraft, on the other hand, is as low as possible.

To this end, the number of support structures used, and their respective position with respect to the aircraft, are defined when the aircraft is designed.

Thus, when manufacturing (or maintaining) an aircraft, accurate determination of the loads linked to the support or support loads is important in order to prevent expensive repairs in the event of damage to the aircraft or to the supports, delays and blockages of the assembly line, or the generation of stress in the finished structure.

Furthermore, good correlation between the predicted and measured loads makes it possible to validate the modeling of the load linked to the support and is able to be used as an additional means in the context of the certification of the structure.

However, obtaining a good correlation between the predicted and measured loads is complicated by the numerous parameters and uncertainties that come into play. In particular, there are uncertainties with regard to masses, stiffnesses and measurements, and uncertainties that are brought about during the process of manufacturing the aircraft (uncertainties regarding dimensions, lack of reproducibility of the process, etc.).

The support loads, generated on account of the shoring of the main structure by a support structure, are primarily impacted by the stiffness of the props and of the cradles. Now, this stiffness is difficult to predict due to the configuration of the elements of the support structure.

Specifically, the props and the cradles generally include large and extremely stiff elements made of steel, and also parts that are not as stiff and that make it possible to adjust the support height thereof, and also parts that are not made of metal and spaces between the constituent elements that bring about non-linear reactions of the structure. Calibration methods in the context of modeling using finite elements are known, but they require the installation of strain gauges and calibration of the modeling using finite elements by comparing the difference between the predicted stress and the measured stress. For example, document FR2935133 describes the implementation of strain gauges in the context of the support or shoring of an aircraft for maintenance thereof.

SUMMARY

The disclosure herein aims to propose a method for calibrating the stiffness of at least one support structure that does not exhibit the abovementioned drawbacks.

The disclosure herein thus relates to a method for calibrating the stiffness of each support structure of an assembly including a main structure and at least one support structure of the main structure. Each support structure is modeled by a deformable and compressible element having a certain stiffness in its direction of extent, and that is thus mechanically comparable to a spring having a certain stiffness in terms of traction/compression.

The method comprises:
  modeling the assembly using finite elements, with a theoretical stiffness of the support structures, under what are called moderate support load conditions, in which the assembly is subjected to support loads that are not liable to damage it;
  calculating calculated reaction forces for each support structure (S1,S2,S3) under the moderate support load conditions;
  measuring corresponding measured reaction forces for each support structure under the moderate support load conditions; and
  calibrating the stiffness of each support structure, by determining a calculated stiffness of each support structure based on the comparison between the calculated reaction forces and the measured reaction forces.

The moderate support load conditions correspond for example to the state in which the main structure, for example a non-flying aircraft, is shored, before carrying out (assembly, conversion or maintenance) operations that will increase the support loads to a potentially critical level. Thus, modeling and simple measurements carried out during a first operational phase, in which the level of the support loads is manifestly not enough to pose a problem, makes it possible to calibrate the stiffness of the support structure(s).

In such a method, modeling the assembly under moderate load conditions may include:
  determining a condensed stiffness matrix of the main structure;
  determining a stiffness matrix of each support structure;
  determining an expanded stiffness matrix by assembling the condensed stiffness matrix of the main structure and the stiffness matrices of each support structure.

The condensed stiffness matrix of the main structure and the stiffness matrices of each support structure may be assembled using a direct stiffness method.

The expanded stiffness matrix of the assembly may be constrained using a penalty method applied to the constrained degrees of freedom.

In the method, reaction forces may be calculated at selected nodes, and measured at the same selected nodes, and the calculated stiffness of each support structure may then be determined using a method based on the comparison between the calculated reaction forces and the measured reaction forces at the selected nodes.

In the method, the method based on the comparison between the calculated reaction forces and the measured reaction forces may for example implement a minimization of the difference between the calculated reaction forces and measured reaction forces using the method of least squares.

The disclosure herein also relates to a method for modeling the assembly including the main structure (NFA) and the at least one support structure, including implementing a calibration method such as described above, and correcting the modeling of the assembly by applying the calculated stiffnesses of each support structure thereto.

The stiffness calibrated in real conditions thus enables reliable modeling of the assembly under all conditions that are subsequently able to be contemplated. In particular, this modeling makes it possible to validate the support structures under the maximum support load conditions of the assembly, or at least under conditions with loads greater than the moderate support loads that are reached during operations carried out on the main structure.

This modeling method may include a subsequent step of applying the corrected modeling under conditions in which the assembly is subjected to what is termed a critical support load, greater than the moderate support load.

In a calibration method or a modeling method such as defined above, the main structure may include an aircraft part and each support structure may include a prop.

A calibration method or a modeling method such as described above may be implemented by a computer. A computer program including instructions may make it possible to implement the calibration method, or the modeling method, when it is loaded and executed by a microprocessor. Thus, the disclosure herein relates lastly to a computer program comprising instructions for implementing a calibration method or a modeling method such as defined above when it is loaded and executed by a microprocessor.

Other particular features and advantages of the disclosure herein will become more apparent in the following description.

BRIEF DESCRIPTION OF THE DRAWINGS

In the appended drawings, given by way of non-limiting example.

DETAILED DESCRIPTION

The example chosen to illustrate the disclosure herein relates to the manufacture, on the base of a commercial aircraft undergoing manufacture, of a cargo aircraft for transporting bulky elements, such as for example constituent assemblies of aircraft (fuselage portions, wings, etc.). For this manufacture, a front, middle and rear part of a fuselage as well as the wings are assembled, so as to obtain what is termed a non-flying aircraft supported by stays that form support structures (situation modeled in FIG. 1), before 'modeling', that is to say converting it, on the support structures, so as to obtain the cargo plane (situation modeled in FIG. 3).

Figure 1:
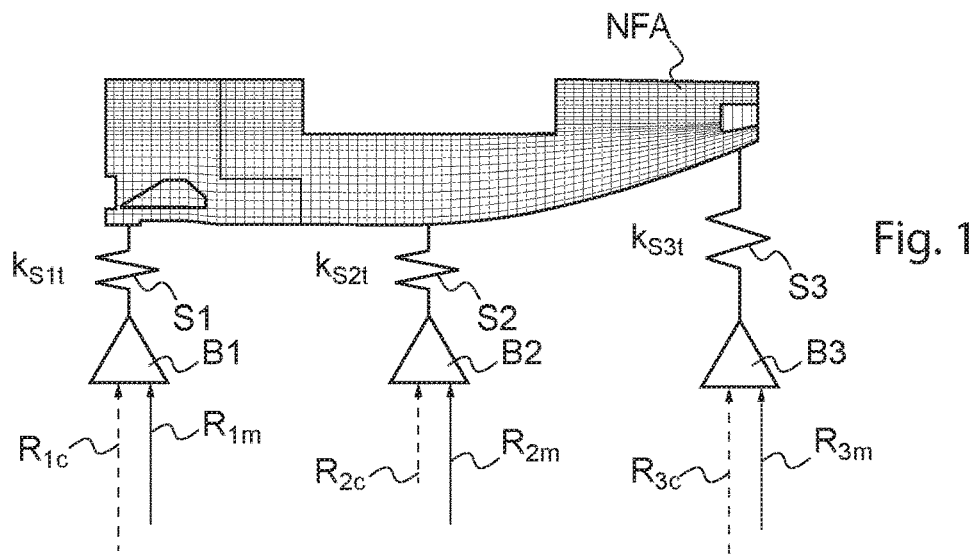
FIG. 1 shows, in a schematic view of the modeling thereof that is performed, an assembly including a main structure and support structures to which a stiffness calibration method according to one embodiment of the disclosure herein, in a moderate support load configuration, is applied.

FIG. 1 thus illustrates an assembly to which a method according to one embodiment of the disclosure herein is applied, including a non-flying aircraft (or an aircraft portion) as main structure NFA of the assembly. The main structure is referenced 'NFA' here as a reference to non-flying aircraft, as the main structure NFA corresponds to a non-flying aircraft in the example shown. A grid has been applied to the main structure 1 so as to model it using finite elements.

In the example shown, the main structure is resting on three support structures, namely a first support structure S1, a second support structure S2 and a third support structure S3.

Each support structure S1,S2,S3 may correspond for example to a prop including an attachment to the main structure, to a prop bearing a cradle for receiving the main structure, or else to an assembly of props (for example two of them) that are positioned longitudinally in the same plane and include an attachment to the main structure or a cradle for receiving it.

Each support structure S1,S2,S3 is modeled by a deformable and compressible element having a certain stiffness in its direction of extent, and is thus mechanically comparable to a spring having a certain stiffness in terms of traction/compression.

Each element representing a support structure is linked firstly to the main structure NFA and secondly to a non-deformable fixed reference B1,B2,B3. This modeling therefore takes into account, in the stiffness of the element, the stiffness of the support structure, but also the potential deformations of the ground on which it is bearing. Nevertheless, and in view of the respective influence of the support structure itself and of the ground, reference is made to determining the support structure, incorporating the stiffness of the ground into this concept.

Thus, the first support structure S1 has, in the model of FIG. 1, a theoretical stiffness $k_{s1_t}$ that is predefined on the basis of the assumed characteristics of the first support structure S1. Similarly, the second support structure S2 has a theoretical stiffness $k_{s2t}$; and the third support structure S3 has a theoretical stiffness $k_{s3t}$.

For a first operational phase, typically corresponding to the situation shown in FIG. 1, and in which it is known that the support loads are not liable to pose a problem (that is to say to cause damage to the main structure, or residual stress in the main structure), theoretical reaction ($R_{1c}$, $R_{2c}$, $R_{3c}$) of each support structure is calculated using the modeling of the first operational phase.

When the first operational phase is actually carried out, the reaction of each support structure is measured. The measured reaction ($R_{1m}$,$R_{2m}$,$R_{3m}$) is compared with the corresponding theoretical reaction ($R_{1c}$, $R_{2c}$, $R_{3c}$). In short, this makes it possible to calibrate the stiffness of each support structure S1,S2,S3.

An example of calculations that are able to be implemented for this purpose is given hereinafter. The calculations below may be carried out by a computer.

In the matrices shown below, the nodes 1 to 3 correspond to the interfaces between the support structures and the main structure, and the nodes 4 to 6 correspond to the connections of the supports to a non-deformable fixed reference B1,B2, B3.

The stiffness of the main structure NFA may be expressed, in a known manner, by a condensed stiffness matrix:

$$K_{NFA} = \begin{array}{c} \\ 1 \\ 2 \\ 3 \end{array} \begin{array}{|ccc|} \multicolumn{3}{c}{1 \quad\; 2 \quad\; 3} \\ \hline k_{11} & k_{12} & k_{13} \\ k_{21} & k_{22} & k_{23} \\ k_{31} & k_{32} & k_{33} \\ \hline \end{array}$$

The stiffness of a support structure i (in the example shown i=1, 2 or 3) may be expressed by the stiffness matrix:

$$K_{support} = \begin{array}{c} \\ i \\ i+3 \end{array} \begin{array}{|cc|} \multicolumn{2}{c}{i \quad\; i+3} \\ \hline k_{si} & -k_{si} \\ -k_{si} & k_{si} \\ \hline \end{array}$$

These matrices may be assembled using a direct stiffness method, as it is most commonly called, so as to obtain an expanded stiffness matrix:

$$K_{NFA\_Expanded} = \begin{array}{c} \\ 1 \\ 2 \\ 3 \\ 4 \\ 5 \\ 6 \end{array} \begin{array}{|ccc|ccc|} \multicolumn{6}{c}{1 \quad\quad 2 \quad\quad 3 \quad\quad 4 \quad 5 \quad 6} \\ \hline k_{11}+k_{s1} & k_{12} & k_{13} & -k_{s1} & & \\ k_{21} & k_{22}+k_{s2} & k_{23} & & -k_{s2} & \\ k_{31} & k_{32} & k_{33}+k_{s3} & & & -k_{s3} \\ \hline -k_{s1} & & & k_{s1} & & \\ & -k_{s2} & & & k_{s2} & \\ & & -k_{s3} & & & k_{s3} \\ \hline \end{array}$$

The expanded matrix is then constrained using a penalty method.

For example, a penalty H is calculated to correspond to $10^8$ times the mean of the diagonal of $K_{NFA\text{-}Expanded}$. The penalty H is added to the constrained degrees of freedom, so as to obtain the penalized expanded matrix:

$$K_{NFA\_Expanded\_P} = \begin{array}{|ccc|ccc|} \hline k_{11}+k_{s1} & k_{12} & k_{13} & -k_{s1} & & \\ k_{21} & k_{22}+k_{s2} & k_{23} & & -k_{s2} & \\ k_{31} & k_{32} & k_{33}+k_{s3} & & & -k_{s3} \\ \hline -k_{s1} & & & k_{s1}+H & & \\ & -k_{s2} & & & k_{s2}+H & \\ & & -k_{s3} & & & k_{s3}+H \\ \hline \end{array}$$

Next, the movements r are calculated using the formula:

$$r = K_{NFA\_Expanded\_P}^{-1} * F$$

in which F corresponds to the external loads.

This makes it possible to calculate the reaction forces R at the selected nodes i using the formula:

$$R_{ic} = H * r_i$$

in which $r_i$ corresponds to the movements at the selected node i.

This makes it possible to compare the calculated reaction forces $R_{ic}$, that is to say in the example shown here $R_{1c}$, $R_{2c}$, $R_{3c}$, with the corresponding measured reaction forces $R_{im}$ in the situation with moderate support loads, namely $R_{1m}$, $R_{2m}$, $R_{3m}$.

In particular, it is possible to use a method of least squares for the purpose of minimizing the square of the difference between the calculated and measured reactions. The error $$ERR = (R_{ic} - R_{im})^2$$

is thus minimized by varying the stiffness of the support structures in the previous calculations. Thus, $R_{ic}$ depends on the stiffness of the supports $K_{s1}$, $K_{s2}$ etc., which is used as an optimization parameter in the calculations.

Figure 2:
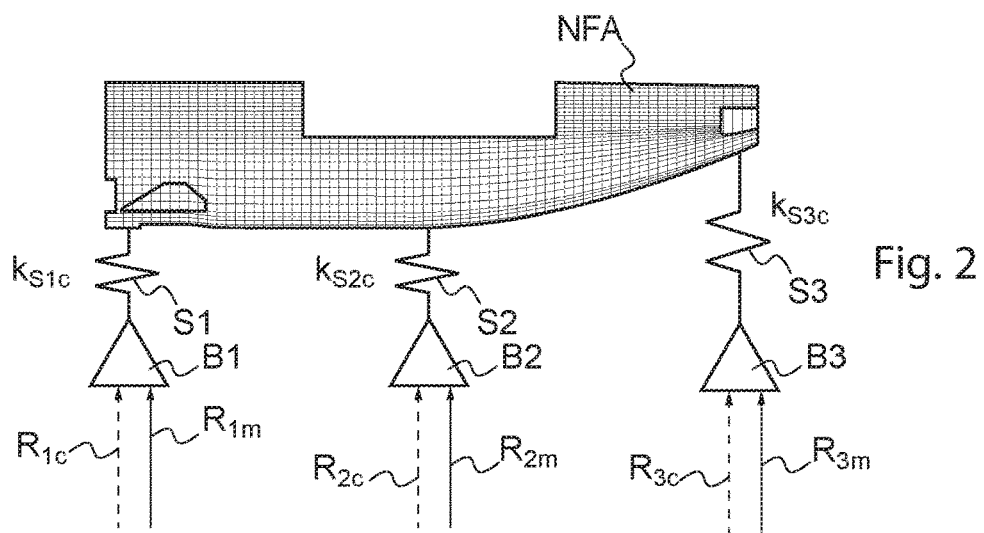
FIG. 2 shows, in a view analogous to that of FIG. 1, the model corresponding to the assembly of FIG. 1 after application of the calibration method in a moderate support load configuration.

In doing this, the model shown in FIG. 2 is arrived at. FIG. 2 shows, in a view analogous to that of FIG. 1, the assembly of FIG. 1 after the calibration method has been applied. The main structure NFA is modeled here using finite elements using the grid adopted in FIG. 1, and is shored by the three support structures S1,S2,S3 to which the calculated stiffnesses $k_{s1c}$, $k_{s2c}$ and $k_{s3c}$ are respectively assigned, the latter resulting in calculated reaction forces $R_{1c}$,$R_{2c}$,$R_{3c}$ that are identical to the corresponding measured reaction forces $R_{1m}$,$R_{2m}$,$R_{3m}$ (or almost identical, depending on the minimization of the error ERR that the steps described above have been able to achieve).

The model is thus calibrated with regard to the stiffness of the support structures, and is able to be used to model the support loads and the consequences thereof under all of the conditions applicable to the modeled assembly and that will be encountered during subsequent operations on the assembly.

Figure 3:
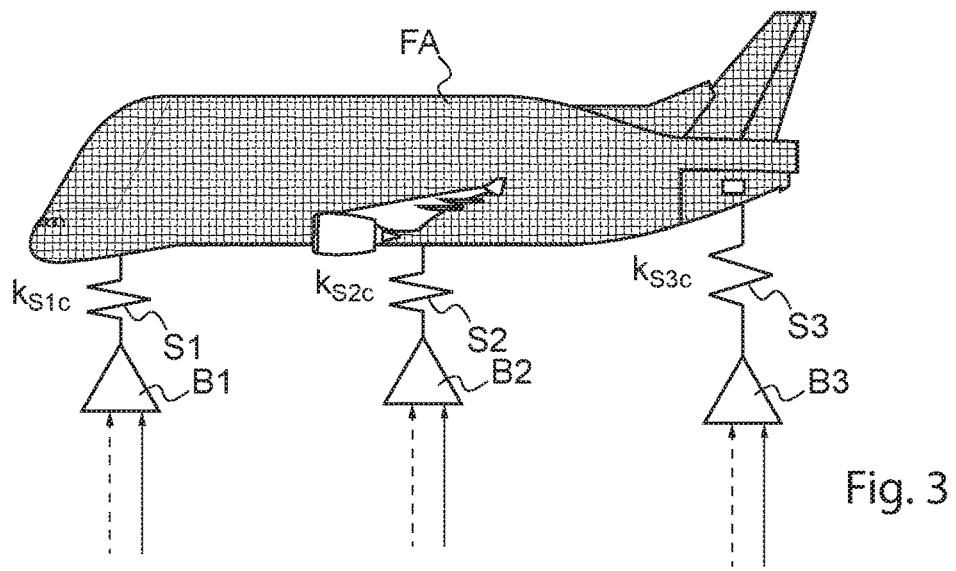
FIG. 3 shows, in a view analogous to those of FIGS. 1 and 2, the assembly of FIG. 1, after conversion of the main structure, in a critical support load configuration.

In particular, FIG. 3 shows the model of FIG. 2 in a maximum support load configuration. This corresponds for example to the configuration after modification of the main structure NFA in order to obtain a cargo plane. Thus, the main structure and the modeling thereof that is performed have changed. The converted main structure FA corresponds to a cargo aircraft after conversion of the main structure NFA modeled in FIGS. 1 and 2. A grid is applied to the converted main structure FA in order to model it using finite elements. The converted main structure FA is shored by the three support structures S1, S2 and S3, to which the corresponding stiffness as calibrated previously, namely $k_{s1c}$, $k_{s2c}$ and $k_{s3c}$, respectively, are applied.

The model shown in FIG. 3 thus makes it possible in particular to calculate the support loads and the consequences thereof, in particular the stress generated in the (initial or converted) main structure, under what are termed the critical support load conditions, corresponding for example to the maximum loads during the operations of manufacturing, modeling or converting the main structure.

The disclosure herein thus proposes a method for calibrating, in real conditions, the stiffness of one or more support structures, allowing the modeling, using finite elements, of an assembly including a main structure shored by the support structures. The calibration, under conditions that are known not to be critical with regard to the support loads generated, makes it possible to obtain a reliable model easily, safely and quickly, in that it avoids a multiplicity of iterations in order to arrive at the model.

The disclosure herein has been described in the example of converting a commercial aircraft into a cargo aircraft, that is to say in the context of an application of the method during the conversion of the aircraft, but is applicable to other situations. For example, the calibration method may be used in the context of certifying the support structures. The calibration method may be applied, in general, to any tool that uses the stiffness of a support structure (lifting tools, coupling tools, etc.).

The subject matter disclosed herein can be implemented in software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one exemplary embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for calibrating stiffness of each physical support structure of a physical assembly including a main structure and at least one support structure of the main structure, each support structure being modeled by a deformable and compressible element having a certain stiffness in a direction of extent of the deformable and compressible element, and that is thus mechanically comparable to a spring having a certain stiffness in terms of traction/compression, the method comprising:
    modeling a digital or virtual model of the physical assembly using finite elements, with a theoretical stiffness of the support structures, under moderate support load conditions, in which the assembly is subjected to support loads that are not liable to damage the assembly;
    calculating calculated reaction forces for each support structure under the moderate support load conditions;
    measuring corresponding measured reaction forces for each support structure under the moderate support load conditions; and
    physically calibrating the stiffness of each physical support structure of the physical, real condition assembly, by determining a calculated stiffness of each support structure based on comparison between the calculated reaction forces and the measured reaction forces.

2. The method according to claim 1, wherein modeling the assembly under moderate load conditions comprises:
    determining a condensed stiffness matrix of the main structure;
    determining a stiffness matrix of each support structure; and
    determining an expanded stiffness matrix by assembling the condensed stiffness matrix of the main structure and stiffness matrices of each support structure.

3. The method according to claim 2, wherein the condensed stiffness matrix of the main structure and the stiffness matrices of each support structure are assembled using a direct stiffness method.

4. The method according to claim 2, wherein the expanded stiffness matrix of the assembly is constrained using a penalty method applied to constrained degrees of freedom.

5. The method according to claim 1, wherein reaction forces are calculated at selected nodes and measured at the selected nodes, and the calculated stiffness of each support structure is determined using a method based on comparison between the calculated reaction forces and the measured reaction forces at the selected nodes.

6. The method according to claim 1, wherein the method based on the comparison between the calculated reaction forces and the measured reaction forces implements a minimization of a difference between the calculated reaction forces and measured reaction forces using a method of least squares.

7. The method according to claim 1, wherein the main structure includes an aircraft part and each support structure includes a prop.

8. A method for modeling physical, real condition assembly including a main structure and at least one physical support structure, comprising:
    implementing a method for calibrating stiffness of each physical support structure of the assembly including the main structure and the at least one support structure of the main structure, each support structure being modeled by a deformable and compressible element having a certain stiffness in a direction of extent of the deformable and compressible element, and that is thus mechanically comparable to a spring having a certain stiffness in terms of traction/compression, the method comprising:
        modeling a digital or virtual model of the physical assembly using finite elements, with a theoretical stiffness of the support structures, under moderate support load conditions, in which the assembly is subjected to support loads that are not liable to damage the assembly;

calculating calculated reaction forces for each support structure under the moderate support load conditions;

measuring corresponding measured reaction forces for each support structure under the moderate support load conditions; and calibrating the stiffness of each physical support structure, by determining a calculated stiffness of each support structure based on comparison between the calculated reaction forces and the measured reaction forces; and correcting the modeling of the assembly by applying the calculated stiffnesses of each support structure thereto.

9. The method according to claim 8, comprising a subsequent step of applying the corrected modeling under conditions in which the assembly is subjected to a critical support load that is greater than the moderate support load.

10. The method according to claim 8, wherein the main structure includes an aircraft part and each support structure includes a prop.

11. One or more non-transitory computer readable media storing instructions that, when executed by the one or more computers, cause the one or more computers to perform operations for calibrating stiffness of each physical support structure of physical, real condition assembly including a main structure and at least one support structure of the main structure, each physical support structure being modeled by a deformable and compressible element having a certain stiffness in a direction of extent of the deformable and compressible element, and that is thus mechanically comparable to a spring having a certain stiffness in terms of traction/compression, comprising:

modeling a digital or virtual model of the physical assembly using finite elements, with a theoretical stiffness of the support structures, under moderate support load conditions, in which the assembly is subjected to support loads that are not liable to damage the assembly;

calculating calculated reaction forces for each support structure under the moderate support load conditions;

measuring corresponding measured reaction forces for each support structure under the moderate support load conditions; and calibrating the stiffness of each physical support structure, by determining a calculated stiffness of each support structure based on comparison between the calculated reaction forces and the measured reaction forces.

12. One or more non-transitory computer readable media storing instructions that, when executed by the one or more computers, cause the one or more computers to perform operations for modeling a physical, real condition assembly including a main structure and at least one physical support structure, comprising:

calibrating stiffness of each physical support structure of the physical assembly including the main structure and the at least one support structure of the main structure, each support structure being modeled by a deformable and compressible element having a certain stiffness in a direction of extent of the deformable and compressible element, and that is thus mechanically comparable to a spring having a certain stiffness in terms of traction/compression, comprising:

modeling a digital or virtual model of the physical assembly using finite elements, with a theoretical stiffness of the support structures, under moderate support load conditions, in which the assembly is subjected to support loads that are not liable to damage the assembly;

calculating calculated reaction forces for each support structure under the moderate support load conditions;

measuring corresponding measured reaction forces for each support structure under the moderate support load conditions; and calibrating the stiffness of each physical support structure, by determining a calculated stiffness of each support structure based on comparison between the calculated reaction forces and the measured reaction forces; and correcting the modeling of the assembly by applying the calculated stiffnesses of each support structure thereto.

\* \* \* \* \*